(12) United States Patent
Miura (10) Patent No.: US 12,356,776 B2
(45) Date of Patent: Jul. 8, 2025

(54) LIGHT EMITTING DEVICE, METHOD FOR MANUFACTURING CAP, AND METHOD FOR MANUFACTURING LIGHT EMITTING DEVICE

(71) Applicant: NICHIA CORPORATION, Anan (JP)

(72) Inventor: Soichiro Miura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 486 days.

(21) Appl. No.: 17/713,905

(22) Filed: Apr. 5, 2022

(65) Prior Publication Data

US 2022/0320389 A1 Oct. 6, 2022

(30) Foreign Application Priority Data

Apr. 6, 2021 (JP) ................. 2021-064499

(51) Int. Cl.
*H10H 20/855* (2025.01)
*H10H 20/01* (2025.01)
*H10H 20/85* (2025.01)

(52) U.S. Cl.
CPC ...... *H10H 20/855* (2025.01); *H10H 20/8506* (2025.01); *H10H 20/0363* (2025.01)

(58) Field of Classification Search
CPC ..... H01L 33/00–648; H01L 27/15–156; H01L 2933/00–0091; H10H 20/855; H10H 20/8506; H10H 20/0363; H01S 5/02208; H01S 5/02315; H01S 5/02325; H01S 5/4093

See application file for complete search history.

(56) References Cited

U.S. PATENT DOCUMENTS

| | | | | |
|---|---|---|---|---|
| 7,602,559 | B2 * | 10/2009 | Jang ................ | G02B 19/0061 362/296.05 |
| 2014/0043826 | A1 * | 2/2014 | Seo ................. | G02B 19/0071 362/296.01 |
| 2015/0311404 | A1 * | 10/2015 | Binder ............. | H01L 33/44 438/26 |

(Continued)

FOREIGN PATENT DOCUMENTS

| | | |
|---|---|---|
| JP | 2011-082455 A | 4/2011 |
| JP | 2012-069977 A | 4/2012 |

(Continued)

*Primary Examiner* — Dao H Nguyen
(74) *Attorney, Agent, or Firm* — Global IP Counselors, LLP (57) ABSTRACT

A light emitting device includes a light emitting element, a substrate, and a cap. The cap surrounds the light emitting element disposed on the substrate, and has a plurality of lateral portions including a first lateral portion having a first inner lateral surface through which the light emitted from a light emitting surface and traveling along an optical axis passes, and a second lateral portion having a second inner lateral surface different from the first inner lateral surface. The first inner lateral surface is inclined at a first inclination angle toward a side where the light emitting element is disposed with respect to a plane perpendicular to the mounting surface. The second inner lateral surface is inclined at a second inclination angle larger than the first inclination angle toward a side where the light emitting element is disposed with respect to a plane perpendicular to the mounting surface.

10 Claims, 8 Drawing Sheets

(56) References Cited

U.S. PATENT DOCUMENTS

2019/0035700 A1    1/2019  Murayama et al.
2019/0207051 A1*  7/2019  Utsumi ................. H10F 77/334
2022/0302094 A1*  9/2022  Hasegawa ............... H10F 77/50

FOREIGN PATENT DOCUMENTS

| JP | 2021-022665 A | 2/2021 |
| JP | 2021-057459 A | 4/2021 |
| WO | 2017/149573 A1 | 9/2017 |

\* cited by examiner

LIGHT EMITTING DEVICE, METHOD FOR MANUFACTURING CAP, AND METHOD FOR MANUFACTURING LIGHT EMITTING DEVICE

CROSS-REFERENCE TO RELATED APPLICATION

This application claims priority to Japanese Patent Application No. 2021-064499, filed on Apr. 6, 2021, the disclosure of which is hereby incorporated herein by reference in its entirety.

BACKGROUND

The present disclosure relates to a light emitting device, a method for manufacturing a cap, or a method for manufacturing a light emitting device.

Japanese Patent Publication No. 2021-22665A discloses a laser light source, having a semiconductor laser element, a substrate having a mounting surface on which the semiconductor laser element is disposed, and a housing that surrounds the semiconductor laser element disposed on the mounting surface. In the laser light source, the inner lateral surface on which the laser light is incident is inclined. In the Japanese Patent Publication No. 2021-22665A, it is described that the housing is made smaller, which helps make the laser light source more compact.

SUMMARY

It is an object of the present disclosure to provide a small light emitting device.

The embodiments include the aspects described below.

A light emitting device includes a light emitting element, a substrate, and a cap. The light emitting element has a light emitting surface that emits light. The substrate has a mounting surface on which the light emitting element is disposed. The cap surrounds the light emitting element disposed on the substrate, and has a plurality of lateral portions. The plurality of lateral portions include a first lateral portion having a first inner lateral surface through which the light emitted from the light emitting surface and traveling along an optical axis passes, and a second lateral portion having a second inner lateral surface different from the first inner lateral surface. The first inner lateral surface is inclined at a first inclination angle toward a side where the light emitting element is disposed with respect to a plane perpendicular to the mounting surface. The second inner lateral surface is inclined at a second inclination angle larger than the first inclination angle toward a side where the light emitting element is disposed with respect to a plane perpendicular to the mounting surface.

A method for manufacturing a cap, includes: forming, in a light-transmissive base member, a lower portion having a first upper surface, and one or more convex portions that project upward from the lower portion, the one or more convex portions having a plurality of lateral surfaces and a second upper surface that shares a part of an outer edge of each of the plurality of lateral surfaces, so that a plurality of recesses are demarcated by the first upper surface of the lower portion and the plurality of lateral surfaces of the one or more convex portions, the plurality of lateral surfaces including a first lateral surface whose angle formed with the second upper surface is more than 90 degrees and less than 100 degrees, and a second lateral surface whose angle formed with the second upper surface is greater than the angle formed by the second upper surface and the first lateral surface; and dividing up the base member to separate the base member into a plurality of caps each provided with a corresponding one of the recesses so that the first upper surface becomes a lower surface of an upper part of the cap, and the plurality of lateral surfaces including the first lateral surface and the second lateral surface become a plurality of inner lateral surfaces including a first inner lateral surface and a second inner lateral surface of the cap.

A method for manufacturing a light emitting device, includes: providing the cap manufactured by the method described above; disposing one or more light emitting elements on a mounting surface of a substrate, and bonding the cap so as to surround the one or more light emitting elements disposed on the mounting surface and so that light traveling along an optical axis and emitted from the one or more light emitting elements passes through the first inner lateral surface.

At least one of the aspects disclosed by embodiments has the effect of contributing to making a light emitting device more compact.

DETAILED DESCRIPTION OF EMBODIMENTS

In the description or the scope of claims herein, when describing a structure or shape as a polygonal shape, such as a triangle, quadrangle, or the like, any of those shapes subjected to processing such as cutting angles, chamfering, beveling, rounding, or the like will be included to that being referred to as a polygon. Similarly, a polygonal shape subjected to processing not only at a corner (one end of a side), but also in the intermediate portion of a side will also be referred to as a polygonal shape. In other words, any polygon-based shape subjected to processing is included in the interpretation of a "polygon" disclosed in the description and the scope of claims herein.

This applies to not only polygons, but also any word that describes a specific shape, such as a trapezoidal, circular, or recessed shape. This also applies when handling each side of a shape. In other words, even if a side is subjected to processing at a corner or in the intermediate portion, the interpretation of a "side" includes the processed portion. In the case of distinguishing a "polygon" or "side" that has been intentionally not processed from a processed shape, it will be expressed with the word, "exact," added thereto, for example, an "exact quadrangle."

In the description or the scope of claims herein, expressions such as upper/lower, right/left, front/rear, forward/rearward, foreground/background, and the like merely describe the relationships among the constituent elements, such as their relative positions, orientations, or directions of the constituent elements, and do not need to match the relationships of such in use.

In the drawings, directions such as the X direction, the Y direction, and the Z direction are sometimes indicated by arrows. The directions of these arrows are consistent throughout the drawings for a given embodiment.

In this specification, when a constituent element or the like is described, for example, it may be called a "member" or a "portion." "Member" indicates an object that is physically treated as a single unit. Something that is physically treated as a single unit can also be something that is treated as a single constituent element in the manufacturing process. On the other hand, "portion" refers to something that does not have to be physically treated as a single unit. For example, "portion" is used to refer to a part of a single member.

The above-mentioned distinction between "member" and "portion" does not indicate any intention to consciously limit the scope of rights in the interpretation of the doctrine of equivalents. That is, even if there is a constituent element called a "member" in the claims, this by itself does not mean that the applicant recognizes that physically treating this constituent element as a single unit is indispensable to the application of the present invention.

In this specification or claims, in the case where there are a plurality of certain constituent elements and a distinction is made in referring to them, the adjectives "first" and "second" may be added to the constituent elements to tell them apart. The things that are being distinguished between may differ between this specification and the claims. Therefore, even if a constituent element is described in the claims with the same adjective as in this specification, what is being specified by this constituent element may not be the same in this specification as in the claims.

For instance, there are constituent elements that are differentiated by the addition of the adjectives "first," "second," and "third" in this specification, and in the case where constituent elements that were modified by "first" and "third" in this specification are mentioned in the claims, for the sake of simplicity those constituent elements may be differentiated by the addition of "first" and "second" in the claims from. In this case, those constituent elements modified by "first" and "second" in the claims indicate constituent elements modified by "first" and "third" in this specification, respectively. The application of this rule is not limited to constituent elements and is reasonably and flexibly applied to other things as well.

Certain embodiments of the present disclosure will be explained below with reference to the drawings. The embodiments described below are provided to give shape to the technical ideas of the present invention and are not intended to limit the present invention. In the explanation below, the same designations and reference numerals denote the same or similar members, for which a redundant explanation will be omitted as appropriate. The sizes of and relative positions of the members shown in the drawings might be exaggerated for clarity of explanation.

First Embodiment

Figure 1:
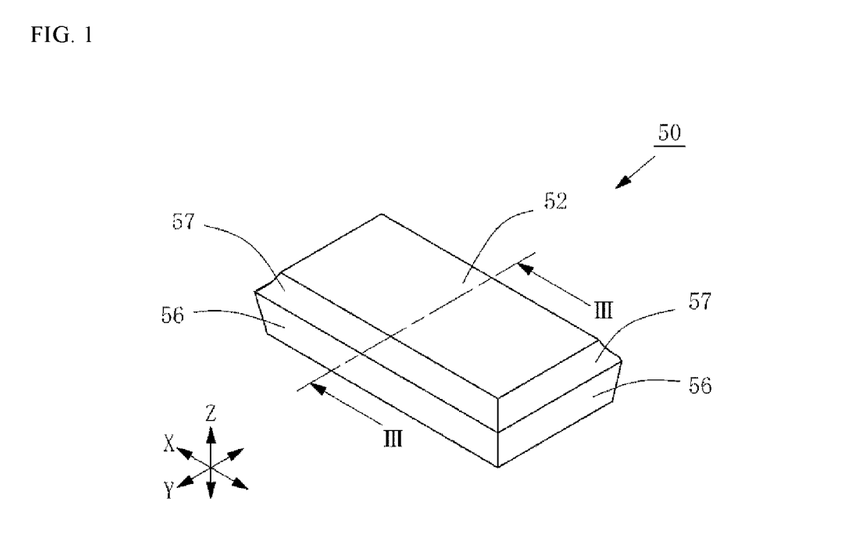
FIG. 1 is an oblique view of the cap according to a first embodiment.
Figure 2:
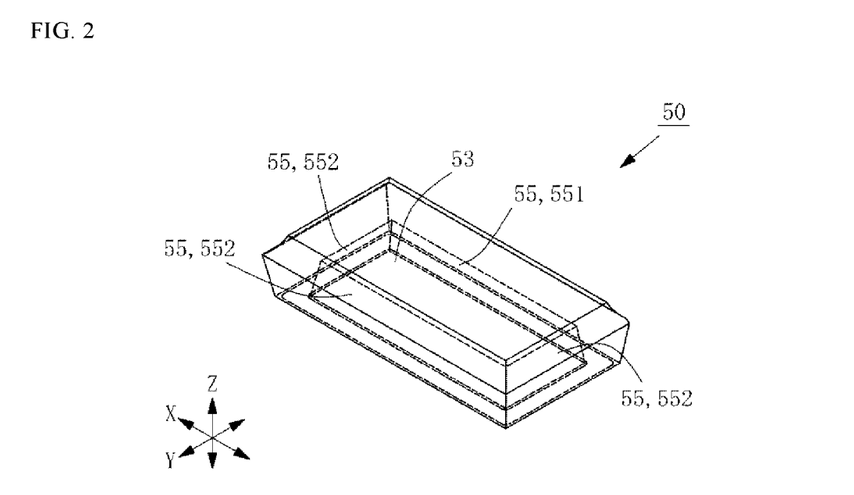
FIG. 2 is a perspective view of the cap according to a first embodiment.
Figure 3:
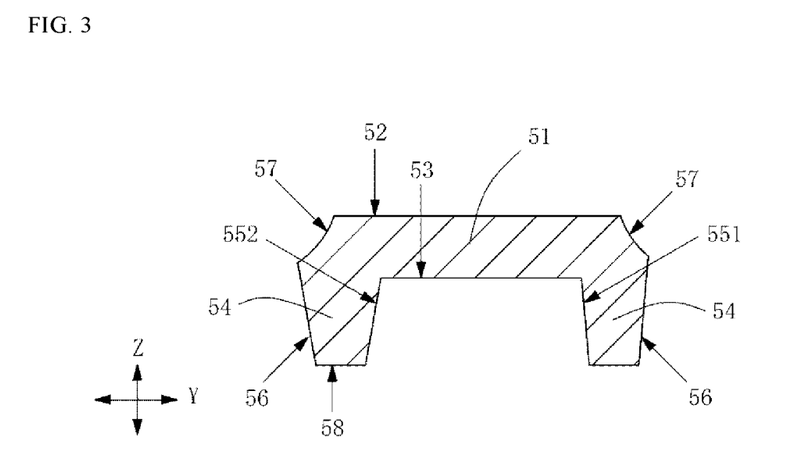
FIG. 3 is a cross-sectional view along the line in FIG. 1.
Figure 4:
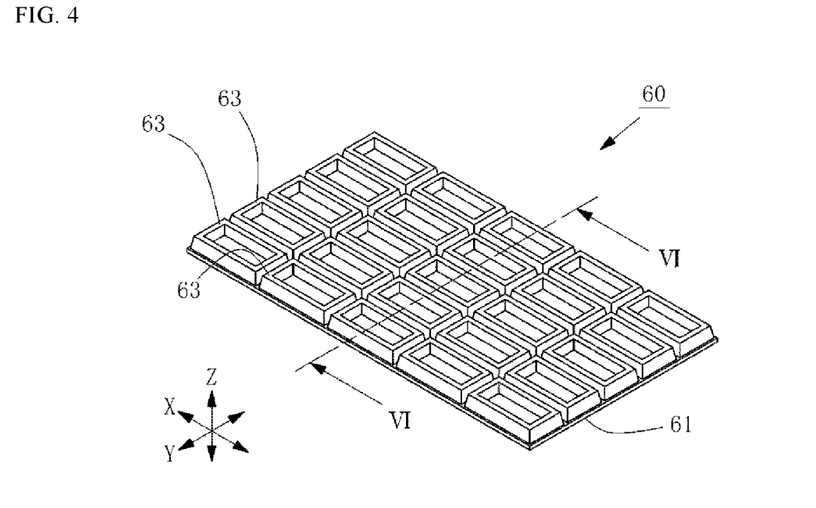
FIG. 4 is an oblique view of the base member according to the method for manufacturing a cap.
Figure 5:
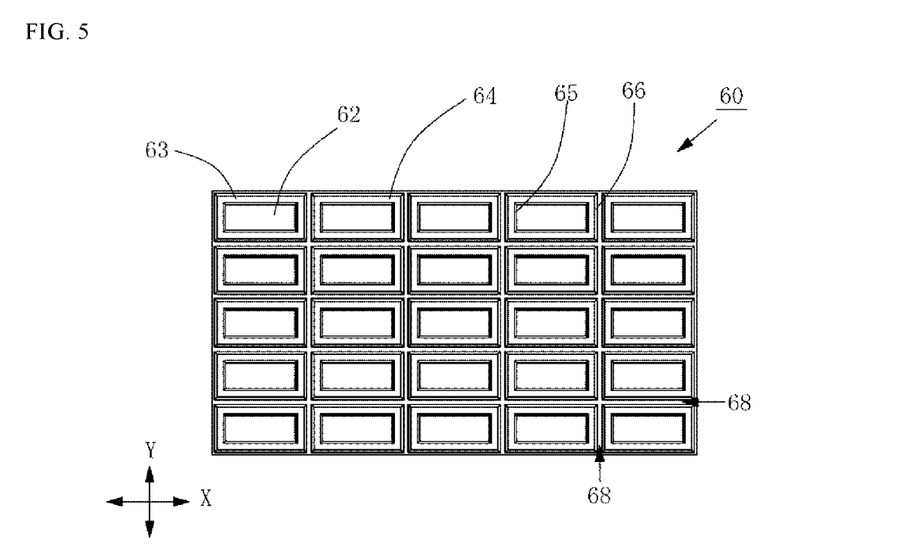
FIG. 5 is a top view of the base member according to the method for manufacturing a cap.

The cap 50 in a first embodiment will be described. FIGS. 1 to 11 are drawings illustrating the physical structure of the cap 50 and an exemplary method of manufacturing the cap 50. FIG. 1 is an oblique view of the cap 50. FIG. 2 is a perspective view of the cap 50. In FIG. 2, reference numbers attached to the figure of the cap 50 refer to the inner parts of the cap 50 shown in see-through form for illustration purposes. FIG. 3 is a cross-sectional view along the line in FIG. 1. FIG. 4 is an oblique view of the base member 60 according to the method for manufacturing the cap 50. FIG. 5 is a top view of the base member 60. FIGS. 6 to 10 are schematic views of the various steps in the manufacturing method of the cap 50. The schematic views of FIGS. 6 to 10 correspond to the cross-sectional view on the VI-VI line of FIG. 4. The cross-sections are not hatched in the drawings to make them simpler and easier to understand. FIG. 11 shows the schematic view of cap 50 manufactured from the base metal 60 for describing the correspondence between the base member 60 and the cap 50.

The cap 50 shown in the drawings is manufactured by going through a plurality of steps, including a step of providing a plurality of recesses in a base member 60, a step of forming an antireflection film 70 on the surfaces demarcating the recesses, a step of polishing the upper surface(s) 64 of convex portion(s) 63, a step of providing a metal film 80 on the upper surface(s) 64 of the convex portion(s) 63, and a step of dividing the base member 60 into a plurality of caps 50.

The method for manufacturing the caps 50 may include steps other than those mentioned above. The caps 50 can also be manufactured by excluding some of these steps.

Each process is described below.

Step of Providing Recesses in Base Member

Figure 6:
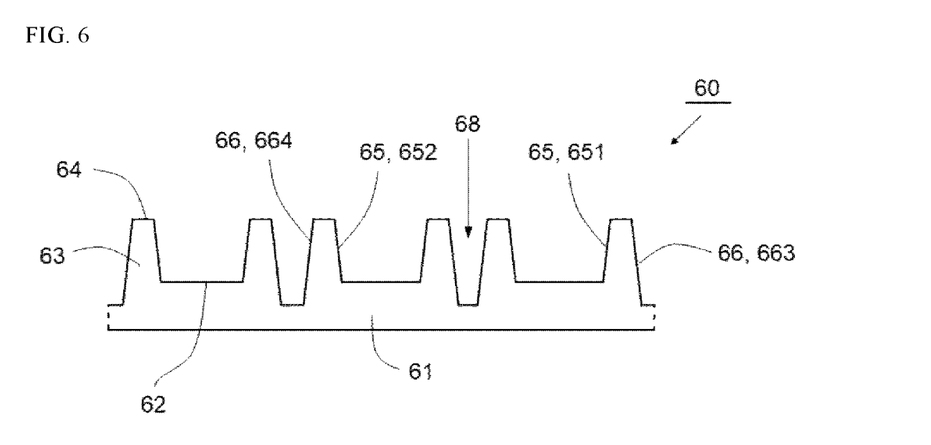
FIG. 6 is a schematic view of one of steps for describing the method for manufacturing a cap.

FIGS. 4 to 6 show the states going through this step. The base member 60 is light-transmissive. The term "light-transmissive" here means that the transmissivity of light is at least 80%. The material need not have a transmissivity of at least 80% with respect to light of all wavelengths. The base member 60 shown in the drawings has a transmissivity of at least 80% with respect to light in the wavelength range of 420 to 1100 nm.

For example, the base member 60 can be formed from a material whose main ingredient is glass. The base member 60 may also be formed by using plastic as the main ingredient. The base member 60 may also be formed by using a mixture whose main ingredients are glass and plastic.

Here, the term "main ingredient" means the material that accounts for the majority of the mass or volume in the article to be formed. In the case where the article is formed from a single material, that material is the main ingredient. That is, a case where a certain material is the main ingredient includes a situation in which the proportion of that material is 100%.

In this step, a lower portion 61 and one or more convex portions 63 protruding upward from the lower portion 61 are formed in the base member 60. The lower portion 61 and the one or more convex portions 63 can be formed, for example, by molding a flat piece of the base member 60. Examples of the method for molding the base member 60 include a method in which the material is put into a mold and cured, a method in which the material is molded by stamping, and so forth. Molding is not the only possible method, and the article may be formed by cutting, for example.

A plurality of recesses are demarcated by the lower portion 61 and the one or more convex portions 63 formed in the base member 60. As a result of this step, the base metal 60 has a plurality of surfaces demarcating the recesses. The lower portion 61 has an upper surface 62, and the upper surface 62 is included in the surfaces demarcating the recesses. The convex portions 63 have a plurality of lateral surfaces 65, and these lateral surfaces 65 are included in the plurality of surfaces demarcating the recesses.

The convex portions 63 have an upper surface 64 that shares a part of the outer edges of the lateral surfaces 65. Here, the upper surface 62 of the lower portion 61 is called the first upper surface 62, and the upper surface 64 of the convex portions 63 is called the second upper surface 64 to distinguish between the two. The second upper surface 64 intersects the plurality of lateral surfaces 65. The outer edges (boundaries) of the recesses are demarcated by the lines of intersection between the second upper surface 64 and the lateral surfaces 65. The second upper surface 64 intersects the lateral surfaces 65 that demarcate the one or more recesses.

In the base member 60 shown in the drawings, in addition to the lower portion 61 and the convex portions 63, a groove 68 are also formed. The plurality of convex portions 63 are partitioned by these groove 68, respectively. A corresponding recess is provided to each of the plurality of convex portions 63. Each convex portion 63 has the second upper surface 64 that intersects the plurality of lateral surfaces 65 that demarcate one recess. For example, in the case where no groove 68 is formed, the plurality of recesses can be demarcated by one convex portion 63.

The lower portion 61 has the first upper surface 62 corresponding to each of the plurality of recesses. The first upper surfaces 62 corresponding to the plurality of recesses is provided all in the same plane. Here, the word "same" encompasses a difference of at least 0 µm and no more than 50 µm. In the base member 60 shown in the drawings, one recess is demarcated by one first upper surface 62 and four lateral surfaces 65.

The lateral surfaces 65 intersect the first upper surface 62. The first upper surface 62 intersects any one of the lateral surfaces 65 all the way around the outer edge. In top view, the first upper surface 62 is surrounded by a plurality of the lateral surfaces 65. In the base member 60 shown in the drawings, the first upper surface 62 is surrounded by four lateral surfaces 65 in top view.

The plurality of lateral surfaces 65 demarcating the recess include at least two lateral surfaces 65 that are inclined with respect to the first upper surface 62. Those lateral surfaces 65 are inclined more toward the directions away from the first upper surface 62 moving upward. In other words, those lateral surfaces 65 are inclined in the direction of expanding the recess. In the base member 60 shown in the drawings, all of the lateral surfaces 65 demarcating the recess are inclined with respect to the first upper surface 62.

For example, in the case where the lower portion 61 and the convex portion(s) 63 are formed on the base member 60 by molding, this entails the work of separating the mold from the molded and cured base member 60. Since the inclined lateral surfaces 65 are provided, the mold that is fitted into the recesses can be pulled out more easily, allowing the caps 50 to be manufactured more stably.

The plurality of lateral surfaces 65 demarcating the recess encompass the first upper surface 62 and demarcate an outer edge that is larger than the first upper surface 62 in top view. In the base member 60 shown in the drawings, the four lateral surfaces 65 demarcate a rectangular outer edge surrounding the recess in top view. This rectangle has long sides and short sides. The long side direction of this rectangle is the same as the X direction, and the short side direction is the same as the Y direction. The length of the long sides of this rectangle is at least 1.2 times and no more than 3 times the length of the short sides.

The two or more inclined lateral surfaces 65 include at least a first lateral surface 651 and a second lateral surface 652. The second lateral surface 652 is a lateral surface 65 whose angle formed with the second upper surface 64 is greater than the angle formed by the second upper surface 64 and the first lateral surface 651. The angle formed by the second upper surface 64 and the lateral surface 65 is an angle of less than 180 degrees. Here, the angle formed by the first lateral surface 651 and the second upper surface 64 is called the first angle (first inclination angle), and the angle formed by the second lateral surface 652 and the second upper surface 64 is called the second angle (second inclination angle).

The first angle is more than 90 degrees and less than 105 degrees, preferably at least 92 degrees and no more than 100 degrees, and more preferably at least 93 degrees and no more than 97 degrees. The lateral surfaces of the manufactured cap 50 are preferably close to being perpendicular to the second upper surface 64, but are best inclined in consideration of stable manufacturing of the caps 50. To strike a good balance, the first angle preferably satisfies one of the numerical ranges given here.

The second angle is more than 95 degrees and less than 120 degrees, preferably more than 95 degrees and no more than 115 degrees, and more preferably more than 95 degrees and no more than 110 degrees, and further preferably at least 100 degrees and no more than 110 degrees. In the case where the second angle is larger, the cap 50 will be larger. On the other hand, the closer the first angle is to 90 degrees, the more a larger second angle will be linked to more stable manufacture. Therefore, it is preferable to satisfy one of the numerical ranges given here, under the condition that the second angle is larger than the first angle. In the base member 60 shown in the drawings, the first angle is 95 degrees and the second angle is 100 degrees.

The two or more inclined lateral surfaces 65 include the second lateral surface 652 facing the first lateral surface 651. It is preferable for the plurality of lateral surfaces 65 demarcating the recess all to be inclined lateral surfaces 65. This makes it easier to stably manufacture the caps 50. In the base member 60 shown in the drawings, the plurality of lateral surfaces 65 demarcating the recess include a first lateral surface 651 whose planar direction is parallel to the X direction, a second lateral surface 652 that faces the first lateral surface 651 and whose planar direction is parallel to the X direction, and two second lateral surfaces 652 whose planar direction is parallel to the Y direction.

The plurality of lateral surfaces 65 demarcating the recess are preferably made up of the first lateral surface 651 and a plurality of the second lateral surfaces 652. In the plurality of lateral surfaces 65, using one as the first lateral surface 651 and the remaining lateral surfaces 65 as the second lateral surfaces 652 makes it easier to manufacture the caps 50.

The inclination of the first lateral surface 651 with respect to the first upper surface 62 is smaller than the inclination of the second lateral surface(s) 652 with respect to the first upper surface 62. In other words, the first lateral surface 651 has an inclination that is more perpendicular with respect to the upper surface 62 than the second lateral surface(s) 652. In top view, the outer edge(s) of the second lateral surface(s) 652 are farther from the upper surface 62 than the outer edge of the first lateral surface 651.

The first upper surface 62 is parallel to the second upper surface 64. The angle formed by the first lateral surface 651 and the first upper surface 62 is equal to the angle formed by the first lateral surface 651 and the second upper surface 64. The word "equal" here encompasses a difference within ±5 degrees. The angle formed by the lateral surfaces 65 and the first upper surface 62 is an angle of less than 180 degrees.

The base member 60 is provided with a groove 68. The groove 68 is provided in a grid pattern in the base member 60. In top view, a convex portion 63 is provided inside each box partitioned by the grid-like groove 68 and a recess is formed. The groove 68 can be said to be provided between adjacent convex portions 63. The groove 68 extends below the first upper surface 62. The groove 68 extends at least 50 µm lower the first upper surface 62.

The depth of the groove 68 from the plane including the second upper surface 64 is greater than the distance from the plane including the second upper surface 64 to the plane including the first upper surface 62. The length in the Z direction from the plane including the second upper surface 64 to the distal end of the groove 68 is greater than the length in the Z direction from the plane including the second upper surface 64 to the plane including the first upper surface 62.

Each of the convex portions 63 have a lateral surface 66. The lateral surfaces 66 of adjacent convex portions 63 face each other with a groove 68 therebetween. The convex portion 63 has the lateral surface 66 on the opposite side from the first lateral surface 651. In the base member 60 shown in the drawings, the lateral surfaces 66 are provided on the opposite side from the plurality of lateral surfaces 65 that demarcate the recess.

A plurality of lateral surfaces 66 include at least a third lateral surface 663 and a fourth lateral surface 664, respectively. The fourth lateral surface 664 is a lateral surface 66 whose angle formed with the second upper surface 64 is greater than the angle formed by the second upper surface 64 and the third lateral surface 663. The angle formed by the second upper surface 64 and the lateral surfaces 66 is an angle of less than 180 degrees. Here, the angle formed by the third lateral surface 663 and the second upper surface 64 is called the third angle, and the angle formed by the fourth lateral surface 664 and the second upper surface 64 is called the fourth angle.

In a convex portion 63, the lateral surface 66 on the opposite side from the first lateral surface 651 is the third lateral surface 663. In a convex portion 63, the lateral surface 66 on the opposite side from the second lateral surface 652 is the fourth lateral surface 664. The distance between the first lateral surface 651 and the third lateral surface 663 is the width of the convex portion 63. The distance between the second lateral surface 652 and the fourth lateral surface 664 is the width of the convex portion 63.

The third angle is greater than 90 degrees and less than 105 degrees, preferably at least 92 degrees and no more than 100 degrees, and the first angle is preferably at least 93 degrees and no more than 97 degrees. The third angle may be the same as the first angle. Similar to the first lateral surface 651, the third lateral surface 663 is a lateral surface of a manufactured cap 50, and is preferably close to being perpendicular to the second upper surface 64.

The fourth angle is more than 95 degrees and no more than 120 degrees, preferably more than 95 degrees and no more than 115 degrees, and more preferably more than 95 degrees and no more than 110 degrees, and further preferably at least 100 degrees and no more than 110 degrees. The fourth angle may be the same as the second angle. In the base member 60 shown in the drawings, the direction perpendicular to the first upper surface 62 is equal to the Z axis direction. The direction perpendicular to the second upper surface 64 is equal to the Z axis direction.

In the base member 60 shown in the drawings, the height from the first upper surface 62 to the second upper surface 64 in the Z axis direction is at least 200 µm and no more than 1500 µm. Of the plurality of lateral surfaces 65 demarcating the recess, the distance between the lateral surfaces 65 that face each other in the X axis direction is at least 400 µm and no more than 5000 µm. Of the plurality of lateral surfaces 65 demarcating the recess, the distance between the lateral surfaces 65 that face each other in the Y axis direction is at least 400 µm and no more than 5000 µm.

Step of Forming an Antireflection Film on Surface Demarcating a Recess

Figure 7:
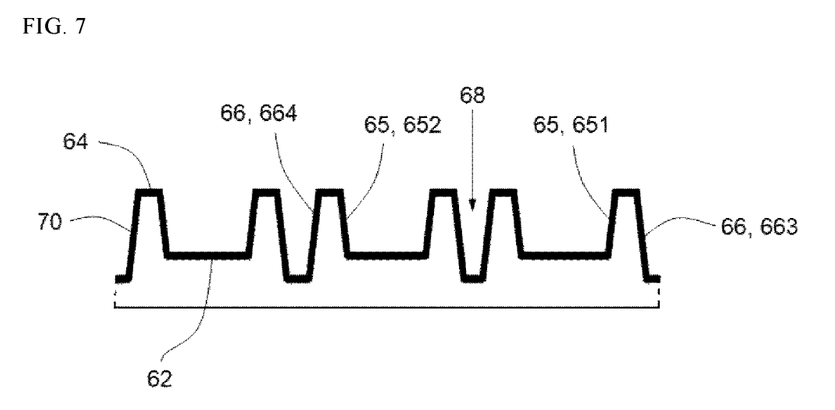
FIG. 7 is a schematic view of another one of steps for describing the method for manufacturing a cap.

FIG. 7 shows the state going through this step. In this step, the antireflection film 70 is formed on the base member 60 in which the recesses have been formed. The antireflection film 70 is formed on the first lateral surface 651. The antireflection film 70 is provided on the lateral surface 66 on the opposite side from the first lateral surface 651.

The antireflection film 70 can be formed, for example, by vapor deposition or sputtering. The antireflection film 70 is formed on the second upper surface(s) 64 and the plurality of lateral surfaces 65 of the one or more convex portions 63. The antireflection film 70 is also formed on the lateral surface(s) 66 of the one or more convex portions 63.

Step of Polishing Upper Surface of Convex Portions

Figure 8:
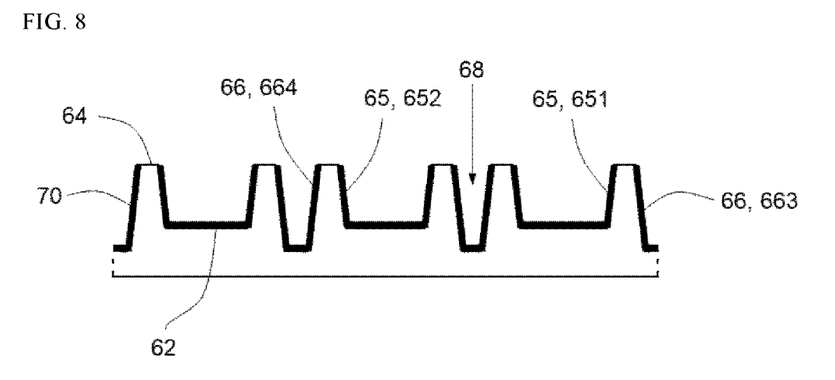
FIG. 8 is a schematic view of another one of steps for describing the method for manufacturing a cap.

FIG. 8 shows the state going through this step. In this step, the second upper surface(s) 64 of the one or more convex portions is polished on the base member 60 on which the antireflection film 70 has been formed, thereby removing the antireflection film 70 formed on the second upper surface 64. The second upper surface 64 polished in this step is a flatter surface than the second upper surface 64 of the convex portions 63 formed in the step of providing a plurality of recesses in the base member.

When the polishing is performed in this step, it is preferable for the conditions relating to the ranges of the first angle and the second angle described in the step of providing a plurality of recesses in the base member to be satisfied with respect to the second upper surface 64 after the polishing.

Step of Providing Metal Film on Upper Surface of Convex Portions

Figure 9:
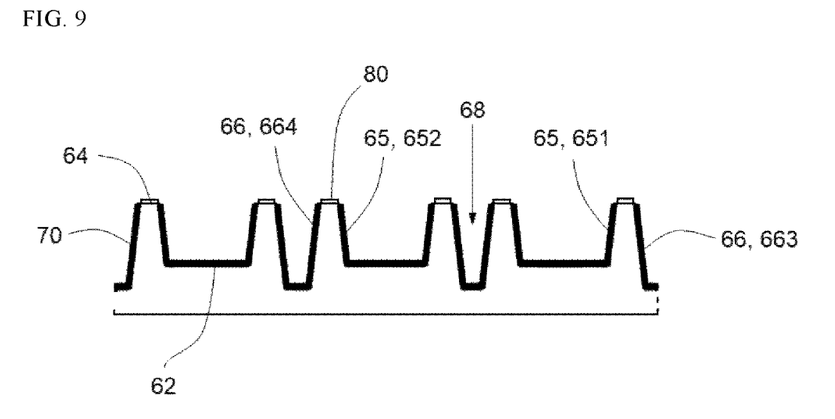
FIG. 9 is a schematic view of another one of steps for describing the method for manufacturing a cap.

FIG. 9 shows the state going through this step. In this step, a metal film 80 is provided on the second upper surface 64 of the convex portion 63. The metal film 80 is provided in an annular shape so as to surround the first upper surface 62 in top view. The metal film 80 can be provided, for example, by vapor deposition or sputtering.

Step of Dividing Base Member into Individual Caps

Figure 10:
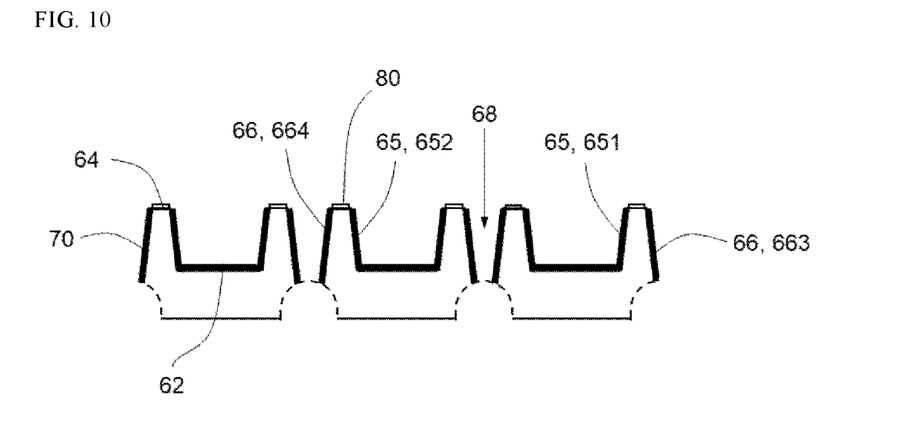
FIG. 10 is a schematic view of another one of steps for describing the method for manufacturing a cap.
Figure 11:
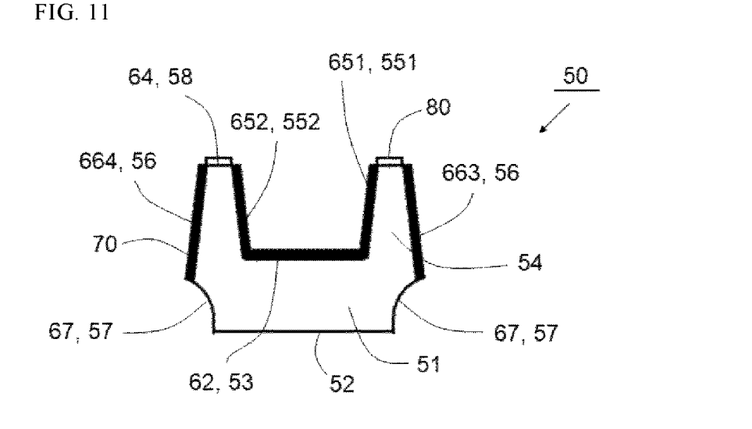
FIG. 11 is a schematic view for describing the correspondence between the base member and the cap in the cap manufactured from the base member.

In FIG. 10, the portion removed in order to divide up the base member in this step is indicated by a dotted line. FIG. 11 shows an individual cap 50 that has obtained through this step. In this step, the base member 60 is divided up. The base member 60 is divided up while leaving the plurality of recesses provided to the base member 60. The base member 60 is divided up and separated into a plurality of caps 50 each having a recess.

The base member 60 directly below the groove 68 is cut to divide up the base member 60 by each recess. For example, the base member 60 is divided up by dicing the base member 60 with a blade capable of cutting the base member 60. The base member 60 is divided up by cutting the base member 60 from the surface of the lower portion 61 on the opposite side from the first upper surface 62, in the direction of the first upper surface 62, and up to a position before reaching the plane including the first upper surface 62.

The distal end of the groove 68 formed in the base member 60 may be smaller than the width of the blade used for dicing the base member 60. In this case, if dicing is performed from the first upper surface 62 side toward the surface of the lower portion 61 on the opposite side from the first upper surface 62, the convex portions 63 may be shaved higher than the first upper surface 62, which is undesirable. Excessive shaving of the convex portions 63 can be avoided by dicing from the surface of the lower portion 61 on the opposite side from the first upper surface 62.

This manufacturing method allows the caps 50 to be stably manufactured while reducing the inclination of at least one lateral surface 65. Keeping the inclination of at least one lateral surface 66 small contributes to making the caps 50 more compact. This means that the small caps 50 can be used to provide compact light emitting devices.

A cap 50 has a first upper surface 62, a second upper surface 64, a plurality of lateral surfaces 65, and a plurality of lateral surfaces 66. The cap 50 has a lower portion 61 and a convex portion 63. The cap 50 may also have a lateral surface 67 formed by dicing. The lateral surface 67 intersects the lateral surface 66 (third lateral surface 663) on the opposite side from the first lateral surface 651. The cap 50 has a plurality of lateral surfaces 67, each of which intersects a respective one of the lateral surface 66. The lateral surfaces 66 are a flatter surface than the lateral surfaces 67. The lateral surfaces 67 can be curved surfaces.

A closed space can be created in the cap 50 by bonding the second upper surface 64 to the flat surface of a substrate, for example. In the case where the cap 50 is disposed on a substrate in this way to create a closed space, the convex portion 63 will be disposed below the lower portion 61.

As shown in FIG. 3, the cap 50 has an upper portion 51 and a plurality of lateral portions 54. The upper portion 51 has an upper surface 52 and a lower surface 53. The plurality of lateral portions 54 have a plurality of inner lateral surfaces 55, a plurality of outer lateral surfaces 56, and a lower surface 58. The plurality of lateral portions 54 have one or more outer lateral surfaces 57. Here, the outer lateral surface 56 is referred to as the first outer lateral surface 56, and the outer lateral surface 57 is referred to as the second outer lateral surface 57.

As shown in FIG. 11, the upper portion 51 of the cap 50 corresponds to the lower portion 61 of the base member 60. The convex portion 63 of the base member 60 corresponds to the plurality of lateral portions 54 of the cap 50. The first upper surface 62 of the base member 60 becomes the lower surface 58 of the cap 50. The plurality of lateral surfaces 65 demarcating the recess in the base member 60 become the plurality of inner lateral surfaces 55 of the cap 50. The lateral surface 66 of the base member 60 becomes the first outer lateral surface 56 of the cap 50. The second upper surface 64 of the base member 60 becomes the lower surface 58 of the cap 50. The lateral surface 67 of the base member 60 becomes the second outer lateral surface 57 of the cap 50. The plurality of inner lateral surfaces 55 of the cap 50 include a first inner lateral surface 551 corresponding to the first lateral surface 651, and a second inner lateral surface 552 corresponding to the second lateral surface 652.

The cap 50 will now be described on the basis of the upper portion 51, the lateral portion 54, the upper surface 52, the lower surface 53, the inner lateral surface 55, the first outer lateral surface 56, the lower surface 58, and the second outer lateral surface 57, which are the constituent elements of the cap 50 described above. For each constituent element of the cap 50, the description given for the constituent elements of the base member 60 will be appropriately followed on the basis of the correspondence with the base member 60 discussed above.

The plurality of lateral portions 54 have inner lateral surfaces 55 that are different from one another. The cap 50 has lateral portions 54 corresponding to the inner lateral surfaces 55. The plurality of lateral portions 54 have first outer lateral surfaces 56 that are different from one another, respectively. The cap 50 has the lateral portions 54 corresponding to the first outer lateral surfaces 56. Here, the lateral portion 54 having the first inner lateral surface 551 is referred to as the first lateral portion 54, and the lateral portion 54 having the second inner lateral surface 55 is referred to as the second lateral portion 54.

The first outer lateral surface 56 of the first lateral portion 54 constitutes a part of the outer edge of the cap 50 in top view. In other words, there is no surface constituting the cap 50 that is farther outside than this first outer lateral surface 56 in top view. In top view, the outer edge of the first outer lateral surfaces 56 of the plurality of lateral portions 54 defines the outer edge of the cap 50. In other words, for any of the plurality of first outer lateral surfaces 56, there is no surface constituting the cap 50 that is farther outside than the first outer lateral surfaces 56 in top view.

The upper ends of the first outer lateral surfaces 56 of the plurality of lateral portions 54 constitute the outer edge of the cap 50 in top view. The upper ends of the first outer lateral surfaces 56 are disposed above the lower surface 58 (in the direction of the upper portion 51). The outer edge of the first outer lateral surface 56 in top view becomes the upper ends of the first outer lateral surfaces 56. The upper end of the first inner lateral surface 551 is lower than the upper end of the first outer lateral surface 56. The upper end of the first inner lateral surface 551 is lower than the lower end of the second outer lateral surface 57.

Modified Example of Step of Dividing Base Member into Caps

Figure 12:
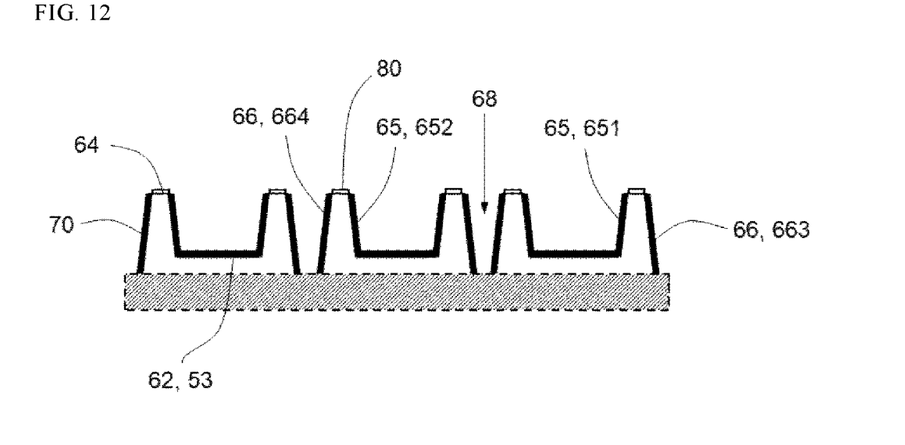
FIG. 12 is a schematic view of one step for describing the method for manufacturing cap in a modified example.
Figure 13:
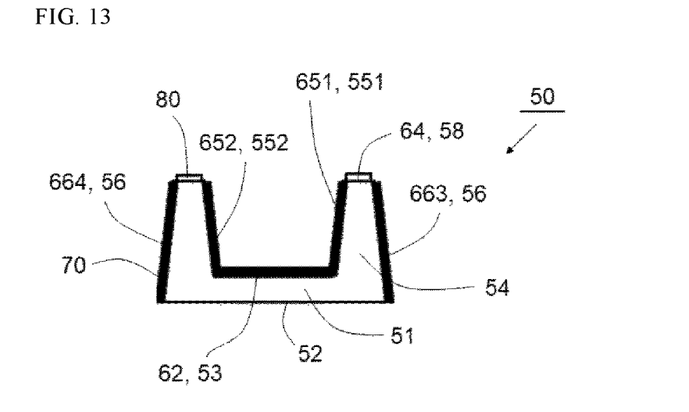
FIG. 13 is a schematic view for describing the correspondence between the base member and the cap in the cap manufactured from the base member in a modified example.

The step of dividing up the base member into a plurality of individual caps can be performed by the method illustrated in FIG. 12, in addition to the method illustrated in FIG. 10. In FIG. 12, the portion to be shaved to divide up the base metal in this step is indicated by hatching surrounded by a dotted line. FIG. 13 shows an individual cap 50 was obtained through this step.

In the example shown in FIG. 12, the base member 60 is divided up by polishing away the base member 60 from the surface of the lower portion 61 on the opposite side from the first upper surface 62, toward the first upper surface 62, all the way to the distal end of the groove 68, and up to a position before reaching the plane including the first upper surface 62.

The individual cap 50 obtained by this method does not have second outer lateral surfaces 57, unlike the cap 50 shown in FIG. 11. The upper surface 52 of the cap 50 intersects the first outer lateral surface 56. The upper surface 52 shares a part of the outer edge with the first outer lateral surface 56 of the first lateral portion 54. The height of the cap 50 shown in FIG. 13 can be made smaller in the up and down direction than that of the cap 50 shown in FIG. 11.

Second Embodiment

Figure 14:
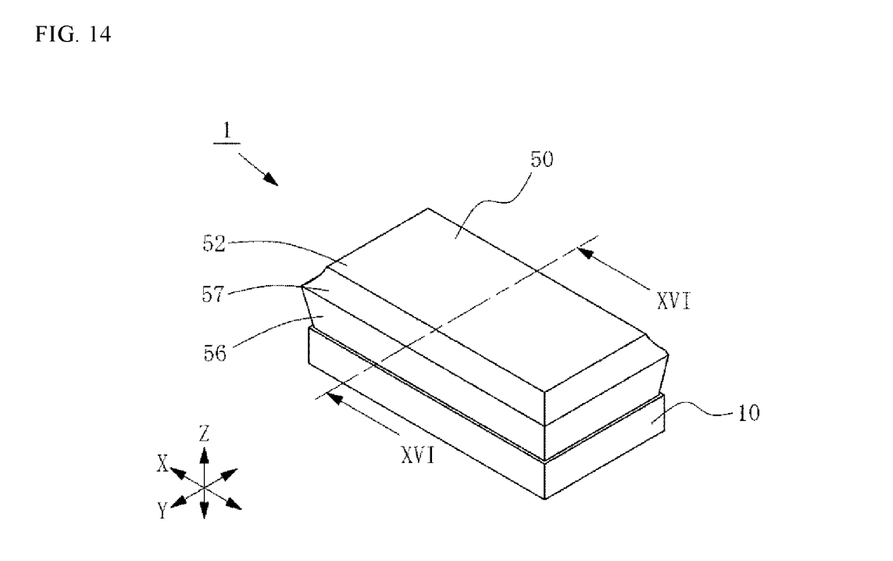
FIG. 14 is an oblique view of the light emitting device according to a second embodiment.
Figure 15:
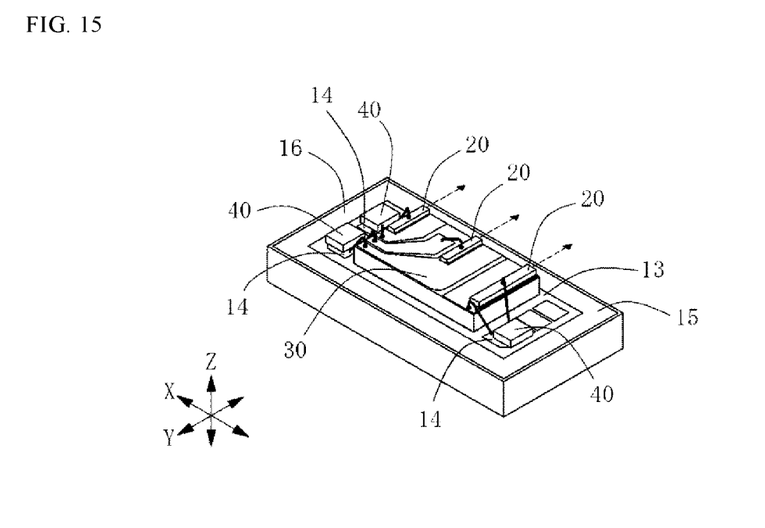
FIG. 15 is an oblique view of the light emitting device according to the second embodiment when the cap has been removed.
Figure 16:
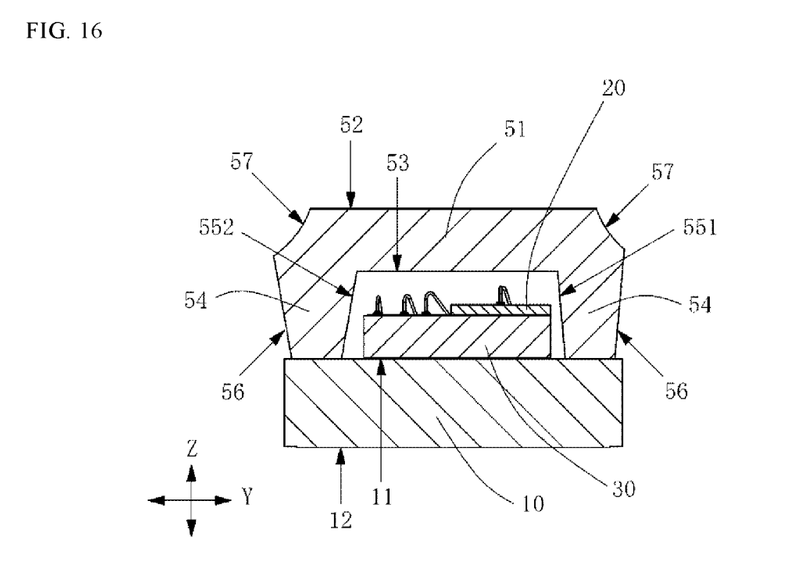
FIG. 16 is a cross-sectional view along the XVI-XVI line in FIG. 14.

The light emitting device 1 having the cap 50 will be described. FIGS. 14 to 16 are drawings illustrating an exemplary form of the light emitting device 1. FIG. 14 is an oblique view of the light emitting device 1, and FIG. 15 is an oblique view of the light emitting device 1 when the cap 50 has been removed. The arrows indicate the direction in which light is emitted from the light emitting surface, i.e, the light emitting end surface, of the light emitting element 20. FIG. 16 is a cross-sectional view along the XVI-XVI line in FIG. 14.

A light emitting device 1 has a plurality of constituent elements. The plurality of constituent elements include a substrate 10, one or more light emitting elements 20, one or more submounts 30, one or more protective elements 40, and the cap 50. The light emitting device 1 may also have other constituent elements. The light emitting device 1 also may not have some of the constituent elements mentioned here.

Substrate 10

A substrate 10 has an upper surface 11, a lower surface 12, and one or more outer lateral surfaces. The shape of the substrate 10 is cuboid, need not be cuboid. In a top view, the outer edge shape of the substrate 10 is rectangular. This rectangle can be a rectangle having long sides and short sides. In the substrate 10 shown in the drawings, the long side direction of this rectangle is the same as the X direction, and the short side direction is the same as the Y direction. In a top view, the outer edge shape of the substrate 10 does not have to be rectangular.

The substrate 10 has a first mounting region 13 and a second mounting region 15 on the upper surface 11 side. In a top view, the first mounting region 13 is surrounded by the second mounting region 15. In the substrate 10 shown in the drawings, the first mounting region 13 is provided on the upper surface 11. The second mounting region 15 is provided on the substrate 10. The first mounting region 13 may be provided on a different surface from the surface on which the second mounting region 15 is provided.

One or more wiring patterns 14 are provided in the first mounting region 13. The wiring pattern 14 is electrically connected to the wiring pattern provided on the lower surface of the substrate 10 via wiring that goes through the interior of the substrate 10. A metal film 16 for bonding is provided in the second mounting region 15.

The substrate 10 can be formed using a ceramic as the main ingredient. Examples of ceramics include aluminum nitride, silicon nitride, aluminum oxide, and silicon carbide. The substrate 10 may also be formed from a material other than a ceramic.

Light Emitting Element 20

The light emitting element 20 has a light emitting surface from which light is emitted. The light emitting element 20 has an upper surface, a lower surface, and a plurality of lateral surfaces. The upper surface or the lateral surface of the light emitting element 20 is the light emitting surface. A semiconductor laser element can be employed as the light emitting element 20. The light emitting element 20 is not limited to being a semiconductor laser element, and a light emitting diode or the like may be used instead.

The light emitting element 20 can be, for example, a light emitting element that emits blue light, a light emitting element that emits green light, or a light emitting element that emits red light. A light emitting element that emits light of some other color may also be used as the light emitting element 20. For instance, the light emitting element 20 may be a light emitting element that emits infrared light.

Here, "blue light" refers to light whose emission peak wavelength falls within the range of 420 nm to 494 nm. "Green light" refers to light whose emission peak wavelength falls within the range of 495 nm to 570 nm. "Red light" refers to light whose emission peak wavelength falls within the range of 605 nm to 750 nm.

Here, a semiconductor laser element, which is an example of the light emitting element 20, will be described. The semiconductor laser element has a rectangular outer shape in which one pair of opposing sides is the long side and the other opposing pair is the short side in top view. The light (laser beam) emitted from the semiconductor laser element has a spread. Divergent light is emitted from the emission end surface of the semiconductor laser element. The emission end surface of the semiconductor laser element can be called the light emitting surface of the light emitting element 20.

The light emitted from the semiconductor laser element forms an elliptical far field pattern (hereinafter referred to as "FFP") on a surface parallel to the light emission end surface. The FFP is the shape and optical intensity distribution of emitted light at a position away from the emission end face.

Here, light that passes through the center of the elliptical shape of the FFP, or in other words, light that has the peak intensity in the light intensity distribution of the FFP, is referred to as the light traveling along the optical axis, or as the light passing through the optical axis. In the light intensity distribution of an FFP, light having an intensity of at least $1/e^2$ with respect to the peak intensity value is called the main portion of light.

The shape of the FFP of the light emitted from the semiconductor laser element is an elliptical shape in which the stacking direction is longer than the direction perpendicular to the stacking direction in a plane parallel to the light emission end face. The stacking direction is the direction in which a plurality of semiconductor layers, including an active layer, are stacked in a semiconductor laser element. The direction perpendicular to the stacking direction can also be said to be the planar direction of the semiconductor layer. The major axis direction of the elliptical shape of the FFP can also be referred to as the fast axis direction of the semiconductor laser element, and the minor axis direction can be referred to as the slow axis direction of the semiconductor laser element.

The angle at which the light with a light intensity of $1/e^2$ of the peak light intensity spreads out, based on the light intensity distribution of the FFP, is defined as the light spread angle of the semiconductor laser element. The light spread angle can be found not only from a light intensity of $1/e^2$ of the peak light intensity, but also from a light intensity that is one-half the peak light intensity, for example. In the description of this specification, when we refer simply to the "light spread angle," we mean the light spread angle at a light intensity of $1/e^2$ of the peak light intensity. The divergence angle in the fast axis direction can be said to be greater than the divergence angle in the slow axis direction.

Examples of a semiconductor laser element that emits blue light or a semiconductor laser element that emits green light include a semiconductor laser element containing a nitride semiconductor. The nitride semiconductor can be, for example, GaN, InGaN, or AlGaN. Examples of a semiconductor laser element that emits red light include those containing InAlGaP-based, GaInP-based, GaAs-based, and AlGaAs-based semiconductors.

Submount 30

The submount 30 has two bonding surfaces and is configured in a cuboid shape. The upper surface of the submount 30 has a rectangular shape. The upper surface of the submount 30 can have a rectangular shape with short and long sides.

The submount 30 is provided with another bonding surface on the opposite side from the first bonding surface. The distance between the two bonding surfaces is shorter than the distance between the other two opposing surfaces. The shape of the submount 30 is not limited to a rectangular cuboid shape. The submount 30 can be formed using silicon nitride, aluminum nitride, or silicon carbide, for example. A metal film for bonding is provided on the bonding surface.

Protective Element 40

The protective element 40 is for preventing the excess flow of current to a specific element (such as a light emitting element 20) that would damage that element. An example of the protective element 40 is a Zener diode. This Zener diode can be one formed from silicon.

Light Emitting Device 1

The light emitting device 1 with the above-mentioned components will now be described.

In the light emitting device 1, one or more light emitting elements 20 are disposed in the first mounting region 13. Each of the one or more light emitting elements 20 is disposed so that its light emitting surface faces sideways. The surface of the substrate 10 on which the light emitting element 20 is disposed shall be referred to as the mounting surface. The first mounting region 13 is included in the mounting surface. In the light emitting device 1 shown in the drawings, the upper surface 11 of the substrate 10 is the mounting surface.

The light emitting device 1 can have a plurality of light emitting elements 20. The light emitting device 1 can have a plurality of light emitting elements 20 that emit light of different colors. With the light emitting device 1 shown in the drawings, the plurality of light emitting elements 20 include a light emitting element 20 that emits a first light having a peak wavelength at a first wavelength, a light emitting element 20 that emits a second light having a peak wavelength at a second wavelength that is different from the first wavelength, and a light emitting element 20 that emits a third light having a peak wavelength at a third wavelength that is different from the first wavelength and the second wavelength. For example, the light emitting device 1 can have a light emitting element 20 that emits red light, a light emitting element 20 that emits green light, and a light emitting element 20 that emits blue light.

The plurality of light emitting elements 20 are disposed side by side so that their light emitting surfaces face in the same direction. The "same direction" here encompasses a case where the rotational deviation of the light emitting surfaces of adjacent light emitting elements 20 in a plane parallel to the first mounting region 13 falls within ±5 degrees. In the light emitting device 1 shown in the drawings, the plurality of light emitting elements 20 are disposed side by side in the X direction.

The light emitted from the light emitting surface of the light emitting element 20 includes light traveling in a direction perpendicular to the light emitting surface. In the light emitting device 1, the direction perpendicular to the light emitting surface is parallel to the mounting surface. Here, the light traveling in a direction perpendicular to the light emitting surface is defined as light traveling along the optical axis of the light emitting element 20. In the light emitting device 1 shown in the drawings, the direction perpendicular to the light emitting surface is the same as the Y direction. The light of an FFP in which the direction perpendicular to the mounting surface is the fast axis is emitted from the light emitting surface of the light emitting element 20 which is the semiconductor laser element.

In the light emitting device 1, one or more light emitting elements 20 are mounted on one or more submounts 30. The submount 30 bonds the light emitting element 20 at one bonding surface, and is bonded to the mounting surface at the other bonding surface. The light emitting element 20 is disposed on the mounting surface via the submount 30. The light emitting element 20 may also be disposed on the mounting surface without using a submount 30. In the light emitting device 1 shown in the drawings, the plurality of light emitting elements 20 are mounted on one submount 30.

In the light emitting device 1, one or more protective elements 40 are disposed on the substrate 10. The one or more protective elements 40 are disposed on the wiring pattern 14 at a position where a part or all of the protective elements 40 overlap the wiring pattern 14 in top view. The protective element 40 may be disposed at a position other than the wiring pattern 14. For example, the protective element 40 can also be disposed on the submount 30. The one or more protective elements 40 are electrically connected to the wiring pattern 14. The protective element(s) 40 are provided on a one-to-one basis with respect to the electric circuits that electrically connect the one or more light emitting elements 20.

In the light emitting device 1, the cap 50 is disposed on the upper surface of the substrate 10. The lower surface 58 of the cap 50 is bonded to the second mounting region 15 of the substrate 10. For example, the metal film 80 provided on the lower surface 58 of the cap 50 and the metal film 16 provided on the second mounting region 15 can be bonded by solder such as AuSn to bond the cap 50 to the substrate 10.

Bonding the substrate 10 and the cap 50 creates a closed space surrounded by the substrate 10 and the cap 50. It is in this space that the light emitting element 20 is disposed. The cap 50 is bonded to the substrate 10 so as to surround the one or more light emitting elements. Therefore, the step of bonding the cap 50 to the substrate 10 is performed after the step of disposing the one or more light emitting elements 20 in the first mounting region 13 of the substrate 10.

Bonding the cap 50 to the substrate 10 under a specific atmosphere creates a hermetically sealed space. In the case where a semiconductor laser element is used for the light emitting element 20, a drop in quality caused by dust collection can be reduced by hermetically sealing the space in which the semiconductor laser element is disposed.

The lower surface 58 of the cap 50 is made into a smoother surface in the step of polishing the upper surface of the convex portion, which improves the mounting accuracy, such as the angle with respect to the mounting surface and the sealing accuracy.

The inner lateral surface 55 of the lateral portion 54 is inclined more to the side where the light emitting element 20 is disposed than the plane perpendicular to the mounting surface. The first inner lateral surface 551 of the first lateral portion 54 is inclined more to the side where the light emitting element 20 is disposed than the plane perpendicular to the mounting surface. The second inner lateral surface 552 of the second lateral portion 54 is inclined more to the side where the light emitting element 20 is disposed than the plane perpendicular to the mounting surface. The second inner lateral surface 552 is inclined more than the first inner lateral surface 551. In the light emitting device 1 shown in the drawings, the plane perpendicular to the mounting surface is parallel to the light emitting surface of the light emitting element 20.

The angle at which the first inner lateral surface 551 is inclined more toward the side where the light emitting element 20 is disposed than the plane perpendicular to the mounting surface can be equal to the angle obtained by subtracting 90 degrees from the first angle in the manufacturing process of the cap 50. Based on the numerical range of the preferred first angle in the manufacture of the cap 50, the angle at which the first inner lateral surface 551 is inclined more toward the side where the light emitting element 20 is disposed than the plane perpendicular to the mounting surface can be greater than zero degrees and less than 15 degrees under certain conditions, at least 2 degrees and not more than 10 degrees under certain conditions, or at least 3 degrees and not more than 7 degrees under certain conditions.

The angle at which the second inner lateral surface 552 is inclined more toward the side where the light emitting element 20 is disposed than the plane perpendicular to the mounting surface can be equal to the angle obtained by subtracting 90 degrees from the second angle in the manufacturing process of the cap 50. Based on the numerical range of the preferred second angle in the manufacture of the cap 50, the angle at which the second inner lateral surface 552 is inclined more toward the side where the light emitting element 20 is disposed than the plane perpendicular to the mounting surface can be greater than 5 degrees and less than 30 degrees under certain conditions, greater than 5 degrees and not more than 25 degrees under certain conditions, greater than 5 degrees and not more than 20 degrees under certain conditions, or at least 10 degrees and not more than 20 degrees under certain conditions.

The cap 50 is disposed so that the light emitted from the light emitting element 20 will pass through the first inner lateral surface 551. The cap 50 is disposed so that the first inner lateral surface 551 faces the light emitting surface of the light emitting element 20. In the light emitting device 1 shown in the drawings, light emitted from the light emitting surface of the one or more light emitting elements 20 and traveling along the optical axis passes through the first inner lateral surface 551. Setting the inner lateral surface 55 on which the light emitted from the light emitting element 20 is incident to be the first inner lateral surface 551 allows the light to be incident on the inner lateral surface 55, which has a smaller inclination with respect to the mounting surface.

In the light emitting device 1, the first inner lateral surface 551 is inclined at an angle of more than zero degrees and less than 15 degrees more toward the side where the light emitting element 20 is disposed than the plane perpendicular to the mounting surface. Also, it is preferable for the first inner lateral surface 551 to be inclined more than zero degrees and no more than 10 degrees more toward the side where the light emitting element 20 is disposed than the plane perpendicular to the mounting surface. The first inner lateral surface 551 is preferably inclined at more than zero degrees and at least 7 degrees more toward the side where the light emitting element 20 is disposed than the plane perpendicular to the mounting surface. The closer the inclination is to vertical, the more the degree to which the light passing through the inner lateral surface 55 travels upward can be suppressed, and the more the size of the light emitting device 1 can be reduced in the up and down direction. An effect of reducing aberration in the light that has passed through the inner lateral surface 55 can also be anticipated.

The light that has been emitted from the light emitting element 20 and passed through the first inner lateral surface 551 is emitted from the first outer lateral surface 56. The first outer lateral surface 56 is disposed to the outermost edge of the cap in relation to the travel direction in which the light emitted from the light emitting element 20 and traveling along the optical axis is emitted from the first outer lateral surface 56.

In the light emitting device 1, the second inner lateral surface 552 is inclined at an angle of more than 5 degrees and no more than 30 degrees more toward the side where the light emitting element 20 is disposed than the plane perpendicular to the mounting surface. The second inner lateral surface 552 is preferably inclined at an angle of more than 5 degrees and no more than 25 degrees more toward the side where the light emitting element 20 is disposed than the plane perpendicular to the mounting surface. The second inner lateral surface 552 is preferably inclined at an angle of more than 5 degrees and no more than 20 degrees more toward the side where the light emitting element 20 is disposed than the plane perpendicular to the mounting surface. The smaller is the inclination, the less likely it is that there will be contact with other components disposed in the closed space, and the easier it is to manufacture a compact light emitting device 1.

In the light emitting device 1, of the inner lateral surfaces 55 had by each of the plurality of lateral portions 54, the first inner lateral surface 551 has the smallest inclination with respect to a plane perpendicular to the mounting surface. Of the plurality of lateral portions 54, the inner lateral surfaces 55 of all the lateral portions 54 except the first lateral portion

54 are inclined at an angle of more than 5 degrees and no more than 30 degrees more to the side where the light emitting element 20 is disposed than a plane perpendicular to the mounting surface.

Modified Example of Light Emitting Device 1

Figure 17:
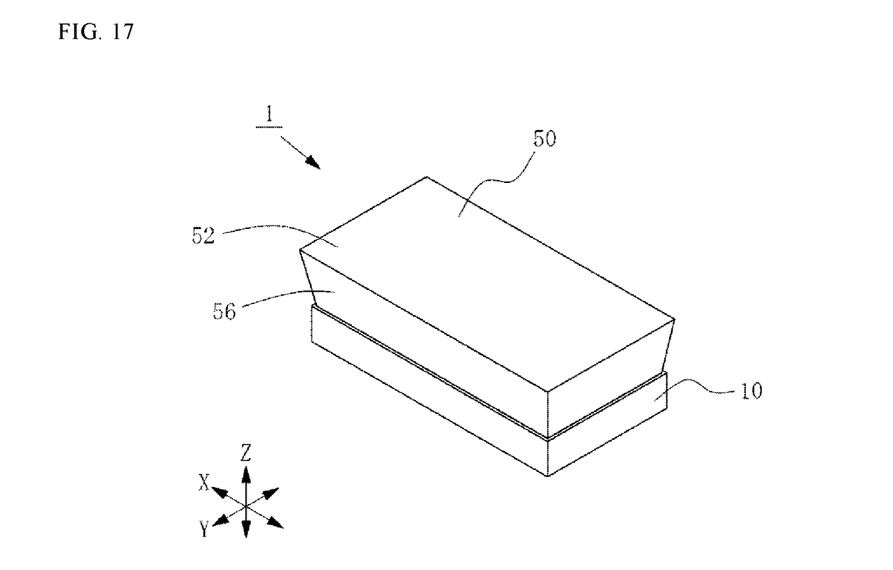
FIG. 17 is an oblique view of a light emitting device in a modification example.

The cap 50 of the modified example described in the first embodiment can also be used as the light emitting device 1. FIG. 17 is an oblique view of the light emitting device 1 having the cap 50 of the modification example. The state in which the cap 50 of the modification example has been removed is the same as in FIG. 15. As shown in FIG. 17, when the cap 50 of the modification example is employed, the lateral surfaces 56 and the upper surface 52 intersect.

Embodiments of the present invention were described above, but the cap and the light emitting device according to the present invention are not strictly limited to the cap and the light emitting device in these embodiments. That is, it is not the case that the present invention cannot be realized except when limited to the outer shape and structure of the cap and the light emitting device disclosed in these embodiments. The present invention does not necessarily have to have all of the constituent elements. For example, in the case where some of the constituent elements of the cap or light emitting device disclosed in the embodiments are not described in the claims, some of those constituent elements may be replaced, omitted, changed in shape, or changed in material, which is recognized as being within the latitude of design by a person skilled in the art, and this specifies that the invention described in the claims is applied.

The light emitting devices described in each embodiment can be used in head-mounted devices, head-mounted displays, projectors, automotive headlights, lighting, displays, etc.

What is claimed is:

1. A light emitting device comprising:
a light emitting element having a light emitting surface that emits light;
a substrate having a mounting surface on which the light emitting element is disposed; and
a cap surrounding the light emitting element disposed on the substrate, and having a plurality of lateral portions, including
a first lateral portion having a first inner lateral surface and a first outer lateral surface, the first inner lateral surface facing the light emitting element so that the light emitted from the light emitting surface and traveling along an optical axis enters the first lateral portion through the first inner lateral surface and exits from the first outer lateral surface, and
a second lateral portion having a second inner lateral surface and different from the first inner lateral surface, the second inner lateral surface facing the light emitting element,
wherein the first inner lateral surface is inclined at a first inclination angle toward a side where the light emitting element is disposed with respect to a plane perpendicular to the mounting surface, and
the second inner lateral surface is inclined at a second inclination angle larger than the first inclination angle toward a side where the light emitting element is disposed with respect to a plane perpendicular to the mounting surface.

2. The light emitting device according to claim 1, wherein among inclination angles of inner lateral surfaces of the plurality of lateral portions with respect to a respective plane perpendicular to the mounting surface, the first inclination angle of the first inner lateral surface is the smallest inclination angle.

3. The light emitting device according to claim 1, wherein the first inclination angle is more than zero degrees and less than 15 degrees.

4. The light emitting device according to claim 3, wherein the second inclination angle is more than 5 degrees and no more than 30 degrees.

5. The light emitting device according to claim 4, wherein the second inner lateral surface faces the first inner lateral surface.

6. The light emitting device according to claim 3, wherein except for the first inclination angle of the first inner lateral surface, an inclination angle of each of inner lateral surfaces of the plurality of lateral portions including the second lateral portion with respect to a respective plane perpendicular to the mounting surface is more than 5 degrees and no more than 30 degrees.

7. The light emitting device according to claim 1, wherein the first outer lateral surface defines an outermost edge of the cap in relation to a travel direction of the light traveling along the optical axis.

8. The light emitting device according to claim 7, wherein the cap has an upper surface,
the first lateral portion has a second outer lateral surface that is disposed between the first outer lateral surface and the upper surface of the cap, and that shares a portion of an outer edge with the first outer lateral surface, and
an upper end of the first inner lateral surface of the first lateral portion is lower than an upper end of the first outer lateral surface of the first lateral portion.

9. The light emitting device according to claim 8, wherein the second outer lateral surface is a curved surface.

10. The light emitting device according to claim 7, wherein
the cap has an upper surface that shares a part of an outer edge of the first outer lateral surface.

* * * * *